United States Patent
Pan et al.

(10) Patent No.: US 10,714,333 B2
(45) Date of Patent: Jul. 14, 2020

(54) APPARATUS AND METHOD FOR SELECTIVE OXIDATION AT LOWER TEMPERATURE USING REMOTE PLASMA SOURCE

(71) Applicant: Applied Materials, Inc., Santa Clara, CA (US)

(72) Inventors: Heng Pan, Santa Clara, CA (US); Matthew Scott Rogers, Mountain View, CA (US); Agus S. Tjandra, San Jose, CA (US); Christopher S. Olsen, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 646 days.

(21) Appl. No.: 15/183,059

(22) Filed: Jun. 15, 2016

(65) Prior Publication Data

US 2016/0300712 A1   Oct. 13, 2016

Related U.S. Application Data

(62) Division of application No. 13/869,208, filed on Apr. 24, 2013, now abandoned.

(Continued)

(51) Int. Cl.
*H01L 21/02* (2006.01)

(52) U.S. Cl.
CPC .. *H01L 21/02238* (2013.01); *H01L 21/02068* (2013.01); *H01L 21/02164* (2013.01); *H01L 21/02252* (2013.01)

(58) Field of Classification Search
CPC ......... H01L 21/02068; H01L 21/02164; H01L 21/02238; H01L 21/02252; G06Q 20/382; G06Q 20/385; G06Q 20/401

(Continued)

(56) References Cited

U.S. PATENT DOCUMENTS 3,818,374 A   6/1974 Emanuel
4,913,929 A   4/1990 Moslehi et al.
(Continued)

FOREIGN PATENT DOCUMENTS

CN   1502120 A   6/2004
JP   53-062982 A   12/1979
(Continued)

OTHER PUBLICATIONS

Office Action for Japanese Application No. 2015-525464 (APPM/016996JP) dated Jul. 25, 2017.
(Continued)

*Primary Examiner* — Dana Ross
*Assistant Examiner* — Joseph W Iskra
(74) *Attorney, Agent, or Firm* — Patterson + Sheridan, LLP

(57) ABSTRACT

Devices and methods for selectively oxidizing silicon are described herein. An apparatus for selective oxidation of exposed silicon surfaces includes a thermal processing chamber with a plurality of walls, first inlet connection and a second inlet connection, wherein the walls define a processing region within the processing chamber, a substrate support within the processing chamber, a hydrogen source connected with the first inlet connection, a heat source connected with the hydrogen source, and a remote plasma source connected with the second inlet connection and an oxygen source. A method for selective oxidation of non-metal surfaces, can include positioning a substrate in a processing chamber at a temperature less than 800° C., flowing hydrogen into the processing chamber, generating a remote plasma comprising oxygen, mixing the remote plasma with the hydrogen gas in the processing chamber to create an activated processing gas, and exposing the substrate to the activated gas.

17 Claims, 4 Drawing Sheets

Related U.S. Application Data

(60) Provisional application No. 61/678,452, filed on Aug. 1, 2012.

(58) Field of Classification Search
USPC .......... 219/520; 438/225, 362, 438; 257/509
See application file for complete search history.

(56) References Cited

U.S. PATENT DOCUMENTS

| | | | |
|---|---|---|---|
| 7,208,428 B2* | 4/2007 | Hishiya | C30B 33/00 257/E21.224 |
| 7,351,663 B1 | 4/2008 | Kabansky et al. | |
| 7,906,440 B2 | 3/2011 | Sasaki | |
| 7,947,561 B2* | 5/2011 | Mani | H01L 21/0223 257/509 |
| 2004/0124460 A1 | 7/2004 | Lim et al. | |
| 2008/0057199 A1 | 3/2008 | Fujita et al. | |
| 2009/0233453 A1 | 9/2009 | Mani et al. | |
| 2010/0151694 A1 | 6/2010 | Peuse et al. | |
| 2011/0189860 A1 | 8/2011 | Porshnev | |
| 2011/0217850 A1 | 9/2011 | Mani et al. | |
| 2012/0094505 A1 | 4/2012 | Nakamura et al. | |
| 2014/0273493 A1* | 9/2014 | Limdulpaiboon | H01L 29/778 438/723 |

FOREIGN PATENT DOCUMENTS

| | | |
|---|---|---|
| JP | H05-259153 A | 10/1993 |
| JP | H09063964 A | 3/1997 |
| JP | 2000-216165 A | 8/2000 |
| JP | 2000-332245 A | 11/2000 |
| JP | 2001338921 A | 12/2001 |
| JP | 2005529491 A | 9/2005 |
| JP | 2005-277253 A | 10/2005 |
| JP | 2006095752 A | 4/2006 |
| JP | 2008060456 A | 3/2008 |
| JP | 2009224736 A | 10/2009 |
| JP | 2010232240 A | 10/2010 |
| JP | 2011-003915 A | 1/2011 |
| JP | 2011029415 A | 2/2011 |
| JP | 2011176330 A | 9/2011 |
| JP | 2012054475 A | 3/2012 |
| JP | 2012516577 A | 7/2012 |
| KR | 10-2008-0020964 A | 3/2008 |
| WO | 2006098300 A1 | 9/2006 |
| WO | 2010/088348 A2 | 8/2010 |

OTHER PUBLICATIONS

International Search Report received dated Nov. 7, 2013 for related application PCT/US2013/051985.
Office Action and Search Report for Chinese Application No. 201380040767.0 dated Aug. 30, 2016.
Japanese Office Action for Application No. 2015-525464 dated Feb. 12, 2019.
Notice of Allowance for JP 2018-080657 dated Oct. 23, 2019.

\* cited by examiner

APPARATUS AND METHOD FOR SELECTIVE OXIDATION AT LOWER TEMPERATURE USING REMOTE PLASMA SOURCE

CROSS-REFERENCE TO RELATED APPLICATIONS

This application claims benefit of U.S. patent application Ser. No. 13/869,208, filed Apr. 24, 2013, which claims benefit of U.S. Provisional Patent Application No. 61/678,452, filed Aug. 1, 2012. Each of the aforementioned applications is herein incorporated by reference.

BACKGROUND OF THE INVENTION

Field of the Invention

Embodiments of the present invention generally relate to apparatus and methods for selectively oxidizing silicon.

Description of the Related Art

Oxidation of silicon is a fundamental technology to CMOS fabrication, dating back to the inception of the integrated circuit. The most common methods for oxidation of silicon rely on thermal processes in ambient of $O_2$, $H_2O/H_2$, $H_2O/O_2$, $O_2/H_2$ or combinations thereof. The hardware used to provide the silicon oxidation process during IC manufacturing are batch thermal furnaces and RTP. In conventional oxidation systems and processes, high temperature (above 700° C.) is required to provide the activation energy for the oxide growth on silicon or poly-silicon.

Advanced integrated circuit fabrication requires a number of process steps where thin films of silicon oxide are grown on silicon or polysilicon structures. For some applications, the oxidation process must be selective, such that other materials including tungsten are not oxidized. Currently thermal processing in either an ambient of $O_2$, $H_2O/H_2$, or $H_2O/O_2$ at high temperature (greater than 700° C.) is used to perform this oxidation processes.

The high temperatures are necessary to obtain the oxide growth rate to make the process practical and in some cases are required for oxide quality. However, many of the next generation devices will undergo serious damage at the point in the process flow where the oxide growth is required, if exposed to the combination of high temperature and an oxidizing environment. Thus, there is a need in the art for methods and apparatus which allow for low temperature selective oxidation of silicon without oxidizing other surface materials.

SUMMARY OF THE INVENTION

Embodiments of the present invention generally relate to methods of selective oxidation of silicon. In one embodiment, an apparatus for selective oxidation of exposed silicon surfaces can include a thermal processing chamber with a plurality of walls having a first inlet connection and a second inlet connection, wherein the plurality of walls define a processing region within the processing chamber, a substrate support within the processing chamber, a hydrogen source in fluid connection with the first inlet connection of the processing chamber, a heat source in connection with the hydrogen source, a remote plasma source in fluid connection with the second inlet connection of the processing chamber, and an oxygen source in fluid connection with the remote plasma source. In some embodiments, the fluid connection can comprise tubing which comprises an inert material.

In another embodiment, a method for selective oxidation of non-metal surfaces, can include positioning a substrate in a processing chamber, wherein the processing chamber is maintained at a temperature less than 800° C., flowing hydrogen into the processing chamber, generating a remote plasma comprising oxygen, flowing the remote plasma into the processing chamber, wherein the remote plasma mixes with the hydrogen gas to create an activated processing gas, and exposing the substrate to the activated gas.

In another embodiment, a method for selective oxidation of non-metal surfaces can include positioning a substrate in a processing chamber, wherein the processing chamber is maintained at a temperature less than 800° C., flowing hydrogen in proximity to a hot wire apparatus to generate activated hydrogen, flowing the activated hydrogen into the processing chamber, generating a remote plasma comprising oxygen, mixing the remote plasma with the hydrogen gas in the processing chamber to create an activated processing gas, exposing the substrate to the activated gas to oxidize a desired amount of silicon, wherein the activated gas oxidizes silicon surfaces and reduces metal surfaces, and cooling the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to methods of selective oxidation of silicon. Embodiments more specifically relate to the selective oxidation of silicon and the selective reduction of tungsten to remove native oxides.

The selective oxidation of Si over tungsten is an important process to repair silicon oxide damage caused by ion implantation or reactive ion etching (RIE) around tungsten gate electrodes on $SiO_2$ dielectric in the advanced CMOS devices. The embodiments described here can be employed to selectively oxidize silicon over non-metals in a rapid thermal processing (RTP) chamber or thermal furnace by using a combination of remote plasma and thermal processing.

Without intending to be bound by theory, the induced Gibbs free energy change during the oxidation of silicon is more than that during oxidation of tungsten, therefore resulting in selective oxidation of silicon over tungsten. In related art oxidation processes, the reaction involves water vapor or combustion of hydrogen and oxygen delivered to the substrate at a high temperature and pressure. High temperature can cause tungsten whiskering, which is the formation of long crystalline structures from the tungsten which can be detrimental to device performance. With consideration of tungsten whiskering, using a lower temperature selective oxidation would be more favorable to overall device performance.

Embodiments of the present invention are described more clearly with reference to the figure below.

Figure 1:
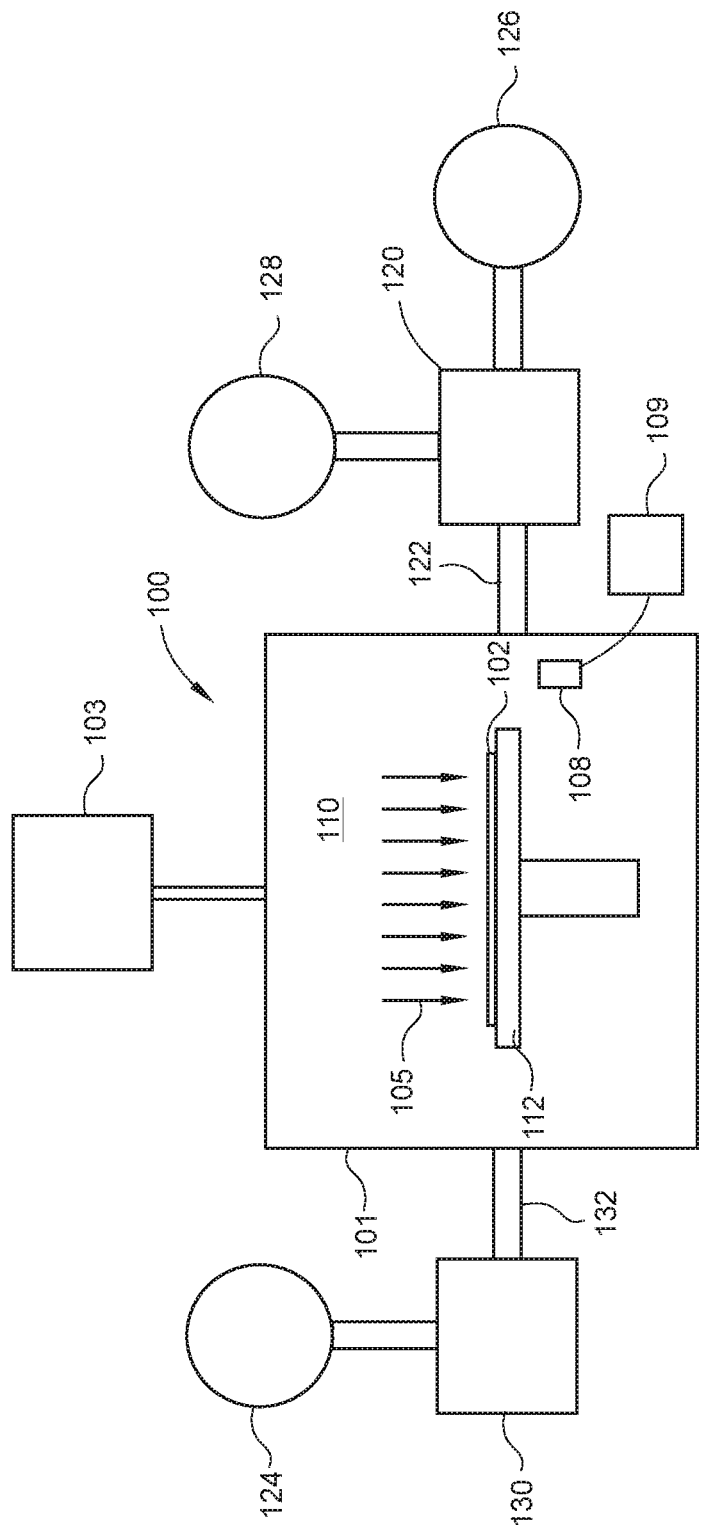
FIG. 1 is a schematic representation of a thermal processing chamber with a remote plasma source according to one embodiment.

FIG. 1 is a RTP chamber with a remote plasma source according to one embodiment. The RTP chamber employed with embodiments of the present invention may be of any type which can heat and cool a substrate while maintaining atmospheric conditions around the substrate, such as the Centura thermal processing system or the Vantage RTP system, available from Applied Materials, Inc. located in Santa Clara, Calif. It is envisioned that other thermal processing chambers, including chambers from other manufacturers, may be employed with embodiments of the present invention without diverging from the scope of the present invention.

The RTP chamber can employ heating from resistive heat, such as a resistive heating element formed in a substrate support, from radiant heat, such as from a heat lamp, or from radiant energy, such as from a laser annealing system.

The processing chamber 100 generally comprises a chamber body 101 defining a processing area 110 in which a substrate 102 may be thermally processed. The substrate 102 is positioned on a substrate support 112 which can help define the processing area 110. An energy source 103 is configured to direct radiant energy 105 towards the processing area 110. A sensor 108 is disposed in position to measure an attribute of components in the interior of the chamber body 101. In one embodiment, the sensor 108 is configured to measure temperature of the substrate 102 by obtaining and measuring radiant energy from the substrate 102. The sensor 108 may be connected to a system controller 109, which may be used to adjust the energy source 103 according to the measurement from the sensor 108.

Connected with the processing chamber 100 is a remote plasma source 120. The remote plasma source employed with embodiments of the present invention may be of any type which can be used to form a remote plasma comprising at least oxygen, such as a R*evolution III Remote RF Plasma Source available from MKS Instruments located in Andover, Mass. It is envisioned that other remote plasma chambers, including chambers from other manufacturers, may be employed with embodiments of the present invention without diverging from the scope of the present invention.

A remote plasma source 120 is fluidly coupled to the processing chamber 100 through a first tubing 122, which can be a line of sight tubing. An oxygen gas source 126 is also fluidly coupled to the remote plasma source 120, such as an inductively coupled remote plasma source. Further embodiments can include an inert gas source 128 coupled with the remote plasma source 120 so as to create an oxygen/inert gas plasma which can be delivered to the processing area 110 of the processing chamber 100.

The first tubing 122 fluidly couples the remote plasma source 120 to the processing chamber 100. The term "line of sight" used herein is meant to convey a short distance between the remote plasma source 120 and the processing chamber 100 so as to minimize the possibility of radical recombination or adsorption onto the surface of the tubing. The first tubing 122 can comprise an inert material, such as sapphire, quartz, or other ceramic material, to prevent adsorption and/or recombination of the oxygen radicals provided by the remote plasma source 120. The first tubing 122 can be configured to provide a direct, short path for oxygen radicals generated in the remote plasma source 120 into the processing chamber 100.

A hydrogen gas source 124 is connected to the processing chamber 100. The hydrogen gas source 124 delivers hydrogen gas to the processing area 110 where the hydrogen gas will be activated by the remote plasma comprising oxygen delivered from the remote plasma source 120. A hot wire apparatus 130 can optionally be positioned between the hydrogen gas source 124 and the processing chamber 100. In embodiments with the hot wire apparatus 130, the hydrogen gas can be flowed over a hot filament of the hot wire apparatus 130 which activates the hydrogen prior to delivering the hydrogen into the chamber. Further, the hot wire apparatus 130 can be connected to the processing chamber using a second tubing 132, such as a line of sight tubing. The composition and parameters for the first tubing 122 can be used for the second tubing 132.

Temperature control is important to the formation of silicon oxide while simultaneously not forming whisker structures on tungsten. As such, the RTP chamber used in embodiments described herein should be able to control temperature between the ranges of 500° C. and 1100° C. with fast heating and cooling of the substrate in the chamber. Such heating and cooling may be performed using structures, such as heating elements and/or coolant ports in the substrate support.

Figure 2:
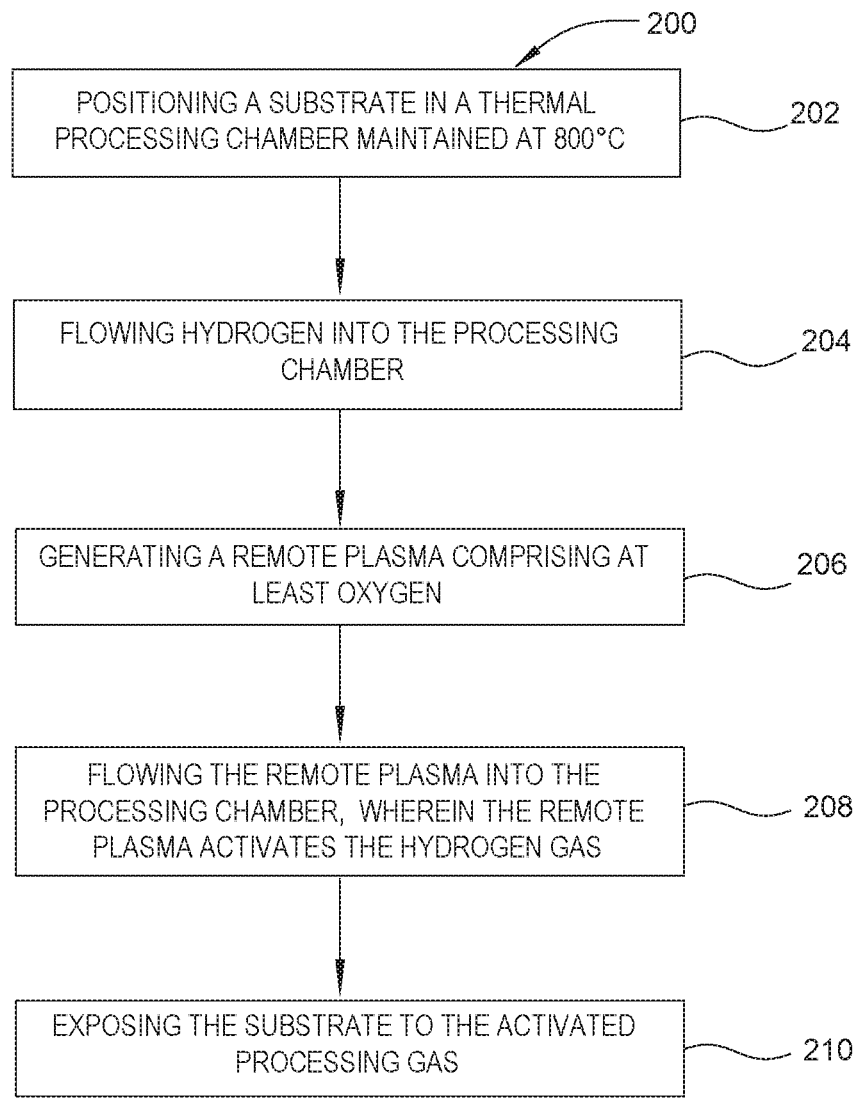
FIG. 2 is a block diagram of a method of selective oxidation according to one embodiment.

FIG. 2 is a block diagram of a method of selective oxidation according to one embodiment. The method 200 can include positioning the substrate in a thermal processing chamber, wherein the substrate is maintained at a temperature less than 800° C., as in step 202. At temperatures above 800° C., tungsten whiskers may form on tungsten features deposited on the surface of a substrate. As the tungsten whiskers grow, they can contact nearby features as well as creating a non-uniform surface of the substrate. Further, maintaining temperatures below about 800° C. is beneficial for applications with a low thermal budget. Therefore, maintenance of the substrate at temperatures below about 800° C., and preferably at or below about 700° C., can be beneficial to the overall functionality of the semiconductor device.

The method 200 can further include flowing hydrogen into the processing chamber, as in step 204. Silicon is difficult to oxidize by conventional thermal oxidation in $O_2$ or $H_2O$, usually requiring a very high temperature and long time. It is known to oxidize in atomic oxygen, including species generated by an oxygen plasma. The use of $O_2$ and $H_2$ mixtures, including $O_2$ activated by a plasma may also allow oxidation of silicon, while also changing the rate and/or the relative rates of oxidation of silicon and other materials, such as tungsten.

For a 300 mm substrate in an appropriately sized chamber, the flow rates of $H_2$ can be from about 1 slm to about 10 slm (from about 3.33 $sccm/cm^2$ to about 33.3 $sccm/cm^2$). The hydrogen can be flowed into the chamber to maintain an overall chamber pressure of between 1 Torr and 2 Torr, such as 1.5 Torr. The temperature of the substrate can be ramped down to between about 550° C. and about 650° C., such as a substrate which is ramped down to about 600° C. In some embodiments, the chamber can be maintained at the same temperature as the substrate.

A further embodiment may include a pre-soak/pre-bake process. In one embodiment, hydrogen ($H_2$) is flowed into a processing chamber with a substrate located therein. The substrate is then soaked in between about 450 Torr and about 550 Torr of $H_2$, for example 530 Torr, while maintaining the substrate at about 700° C. The substrate then remains in the $H_2$ soak for a short period of time, such as between about 45 and about 75 seconds, such as 60 seconds. Related data shows that a pre-soak in $H_2$ may benefit the formation of silicon oxide while simultaneously reducing the native oxide formed on the surface of the tungsten.

Yet further embodiments can include the use of hot wire activation of the $H_2$ prior to flowing the $H_2$ into the chamber. In this embodiment, $H_2$ is flowed over a hot filament. The filament can be composed of a corrosion resistant metal or alloy, such as tungsten or ruthenium-tungsten. The hot filament can activate the hydrogen without forming a plasma, thereby preventing some of the more deleterious effects which can be seen when using hydrogen as a plasma. The activated hydrogen, which will comprise $H_2$ and ionized hydrogen, is flowed into the processing chamber where the activated hydrogen can both extract oxygen from the native oxides formed on the surface of exposed metals, such as tungsten, and deposit oxygen onto the silicon. The reduction of tungsten has been seen from 70 atomic % to 95 atomic % hydrogen.

The method 200 can further include generating a remote plasma comprising oxygen, as in step 206. There are a number of issues regarding the formation of $H_2$ as a remote plasma. First and foremost, $H_2$, when converted to a plasma, can attack the source and other chamber components, such as components composed of anodized aluminum, quartz and sapphire. This reaction can lead to premature source failure. Further, the reaction with $H_2$ can create deposition precursors such as metal hydrides, which can deposit on the substrate. By forming a remote plasma of the oxygen alone, activated species of oxygen can be formed with minimal damage to the substrate and without having the deleterious effects of hydrogen plasma when contacting other portions of the chamber. Further, the activated oxygen can be used to activate the hydrogen in the presence of the substrate so as to limit the effects of the ionized/radicalized hydrogen to the substrate.

The oxygen gas is flowed into the remote plasma source at from about 1 slm to about 5 slm for a 300 cm$^2$ substrate (from about 3.33 sccm/cm$^2$ to about 16.67 sccm/cm$^2$). The oxygen gas can be mixed with an inert gas to form an oxygen gas mixture. The inert gas can include gases such as argon, helium or krypton. Either the oxygen gas or the mixture can then be converted to a plasma using an energy source. The energy source can be a capacitive, inductive or microwave energy source.

The method 200 can further include flowing the remote plasma into the processing chamber, wherein the remote plasma mixes with the hydrogen gas to create an activated processing gas, as in step 208. The plasma can be either allowed to quench before flowing or flowed as a plasma into the chamber through the line of sight tube. The plasma is mixed with the hydrogen over the substrate, creating H, O and OH molecules. The temperature of the substrate is maintained between 550° C. and 650° C., such as at 600° C., to benefit the formation of silicon oxides.

In one embodiment, the hydrogen which was flowed into the chamber in the pre-bake step may be reused as the hydrogen gas for the activated processing gas. Further embodiments can include clearing the chamber with an inert gas or hydrogen gas prior to flowing in hydrogen to create the activated gas. These steps can occur simultaneously with the formation of the oxygen plasma. As well, the hydrogen may be flowed into the chamber before the oxygen plasma is flowed from the remote plasma source or flowed simultaneously to mix with the oxygen plasma over the substrate.

The method 200 can further include exposing the substrate to activated gas to oxidize the silicon and reduce exposed metals, such as tungsten, as in step 210. Plasma oxidation of silicon generally obeys an Arrhenius-like dependence with temperature, but with a much lower activation energy than thermal oxidation owing to the presence of oxygen radicals formed in the plasma. Due to the activation of the oxygen and subsequent or concurrent activation of the hydrogen, the silicon is oxidized. Further, the activated species of hydrogen and oxygen can lead to the reduction of tungsten under the same conditions.

Figure 3A:
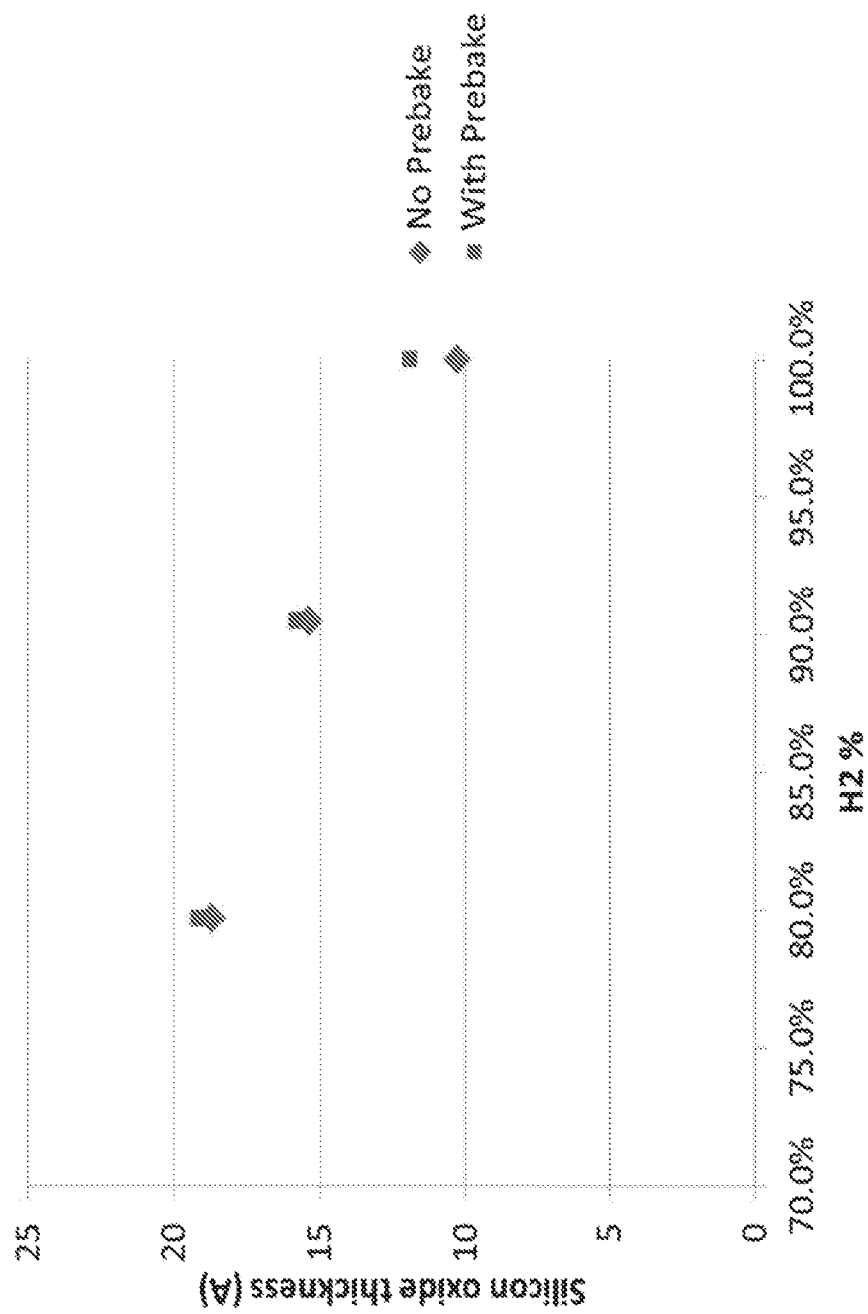
FIGS. 3A and 3B are graphical representations of selective oxidation and reduction achieved both with and without pre-baking.

FIG. 3A is experimental data showing increased silicon oxide growth on silicon substrates. All data was collected from 300 mm bare silicon substrates. The substrates were initially heated to 700° C., followed by an optional pre-bake step. The optional pre-bake step includes a soak for 60 seconds in $H_2$ at a pressure of 530 Torr. After the pre-bake step, the temperature was ramped down to 600° C. and the pressure was ramped to 1.5 Torr. During the selective oxidation portion, the temperature was maintained at 600° C. Remote plasma was produced from oxygen with source power fixed at 3000 W for 60 seconds and then flowed into the chamber where it was mixed with $H_2$ which is flowed separately in the chamber. The total pressure of $H_2$ and $O_2$ in the chamber was 1.5 Torr.

The graphical representation shows silicon oxide thickness from 80 atomic ° A to 100 atomic % $H_2$. Silicon growth was higher between 80 atomic % and 90 atomic ° A hydrogen (with 20 atomic % and 10 atomic % oxygen respectively). As discovered in further similar experimentation (not shown here), between 70 atomic % and 95 atomic ° A hydrogen (with 30 atomic % and 5 atomic % oxygen respectively) provides optimal oxide growth on silicon. Silicon oxide thickness is consistently higher for pre-baked silicon substrates over the unbaked silicon substrate providing between 0.2 A and 0.8 A of increased thickness without the need for increased temperatures. The pre-bake silicon oxide is significantly higher in the 100% $H_2$ sample which may be oxide growth from sequestered oxygen redistributed by hydrogen in the presence of native oxides.

Figure 3B:
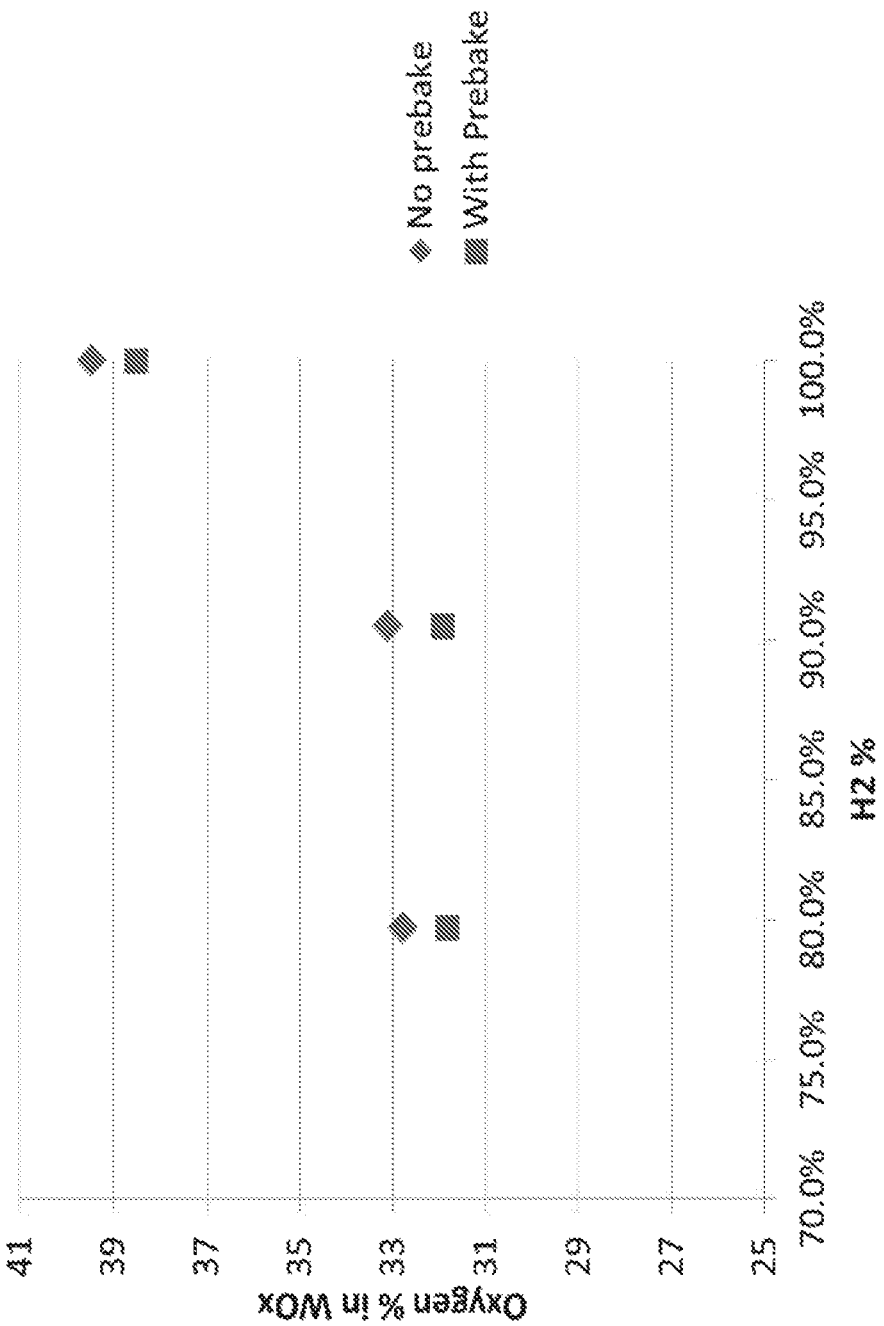

FIG. 3B is experimental data showing reduction of native tungsten oxides. All data was collected from 300 mm silicon substrates with deposited tungsten by CVD processes. The substrates were initially heated to 700° C., followed by an optional pre-bake step. The optional pre-bake step includes a soak for 60 seconds in $H_2$ at a pressure of 530 Torr. After the pre-bake step, the temperature was ramped down to 600° C. and the pressure was ramped to 1.5 Torr. During the selective oxidation portion, the temperature was maintained at 600° C. Remote plasma was produced from oxygen with source power fixed at 3000 W for 60 seconds and then flowed into the chamber where it was mixed with $H_2$ which is flowed separately in the chamber. The total pressure of $H_2$ and $O_2$ in the chamber was 1.5 Torr.

The graphical representation shows a general decrease in native tungsten oxide thickness in the presence of both hydrogen and oxygen, as compared to no oxygen. Oxide concentration was measured using X-ray photoelectron spectroscopy (XPS). The XPS measurement shows 38-39%

Oxygen % in as-deposited tungsten (native $WO_x$). The decrease in native $WO_x$ content was higher between 80 atomic °A and 90 atomic % hydrogen (with 20 atomic % and 10 atomic % oxygen respectively). As discovered in further similar experimentation (not shown here), between 70 atomic °A and 95 atomic % hydrogen (with 30 atomic % and 5 atomic % oxygen respectively) can be used for reduction of native $WO_x$. Related to silicon oxide thickness, native $WO_x$ is consistently lower for pre-baked tungsten coated substrates over the unbaked tungsten coated substrates, providing between 2% and 3% of oxide reduction without the need for increased temperatures. The pre-bake native $WO_x$ is lower in the 100% $H_2$ sample which evidences a benefit to the pre-bake process in overall native $WO_x$ reduction that behaves synergistically with the oxygen treatment.

Though discussed previously, tungsten can form oxides by contact with the atmosphere, such as during transfer between chambers. These oxides can degrade the functionality and shorten the life of tungsten features formed on a substrate. As such, it is important to remove these defects. Therefore, the benefits of decreased native $WO_x$ formation can be achieved using the same process and conditions as are taught for low temperature silicon oxide production. Further, it is believed that the combination of reducing tungsten and oxidizing silicon by the same process may be further synergistic by sequestering oxygen from the native $WO_x$ layer and forming silicon oxide on the exposed silicon.

With hydrogen concentrations higher than 80%, XPS measured 0% in the tungsten film has dropped to 31% to 33% as result of reduction depending on temperature, pre-bake condition and RP power. It is therefore concluded that selective oxidation can be realized with hydrogen concentration in the chamber of at least 80 atomic % at 600° C. The experimental parameters described here are not intended to be limiting, as other temperatures, pressures, flow rates and device parameters as described above may provide the same benefits as disclosed here.

Embodiments described herein relate to an apparatus and method of selectively oxidizing exposed silicon while reducing native $WO_x$. During processing of substrates, such as during the formation of NAND flash devices, the silicon oxide layer may be damaged by processes such as etching. Further, as shown above, as-deposited metals, such as tungsten, contain native oxides which may be detrimental to device performance. The apparatus and methods described above can both reduce native oxide on the deposited metals while simultaneously forming silicon oxide from the exposed silicon, without temperatures over 800° C.

While the foregoing is directed to embodiments of the present invention, other and further embodiments of the invention may be devised without departing from the basic scope thereof, and the scope thereof is determined by the claims that follow.

The invention claimed is:

1. A method for selective oxidation of non-metal surfaces, comprising:
    positioning a substrate in a processing chamber, wherein the processing chamber is maintained at a pressure less than 2 Torr;
    flowing activated hydrogen gas into the processing chamber through a first inlet, the activated hydrogen gas activated by a hot wire apparatus;
    soaking the substrate in the activated hydrogen gas in the absence of plasma comprising oxygen;
    generating a remote RF plasma comprising oxygen after soaking the substrate in the activated hydrogen gas;
    flowing the remote RF plasma into the processing chamber through a second inlet, wherein the remote RF plasma mixes with the activated hydrogen gas to create an activated processing gas; and
    exposing the substrate to the activated processing gas.

2. The method of claim 1, wherein hydrogen comprises at least 70 atomic percent of the activated processing gas as compared to oxygen.

3. The method of claim 2, wherein hydrogen comprises at most 95 atomic percent of the activated processing gas.

4. The method of claim 1, wherein the soak process is maintained at a temperature between 600° C. and 800° C. for at least 45 seconds.

5. The method of claim 1, wherein the flow rates of the hydrogen gas are from about 3.33 $sccm/cm^2$ to about 16.67 $sccm/cm^2$.

6. The method of claim 1, wherein the flow rates of the hydrogen gas are from about 3.33 $sccm/cm^2$ to about 33.3 $sccm/cm^2$.

7. A method for selective oxidation of non-metal surfaces, comprising:
    positioning a substrate in a processing chamber, wherein the processing chamber is maintained at a pressure less than 2 Torr;
    flowing hydrogen gas in proximity to a hot wire apparatus to generate activated hydrogen gas;
    flowing the activated hydrogen gas into the processing chamber through a first inlet;
    soaking the substrate in the activated hydrogen gas in the absence of plasma comprising oxygen;
    generating a remote RF plasma comprising oxygen after soaking the substrate in the activated hydrogen gas;
    flowing the remote RF plasma into the processing chamber through a second inlet;
    mixing the remote RF plasma with the activated hydrogen gas in the processing chamber to create an activated processing gas;
    exposing the substrate to the activated processing gas to oxidize a desired amount of silicon, wherein the activated processing gas oxidizes silicon surfaces and reduces tungsten surfaces; and
    cooling the substrate.

8. The method of claim 7, wherein hydrogen comprises at most 95 atomic percent of the activated processing gas.

9. The method of 7, wherein the soak process is maintained at a temperature between 600° C. and 800° C. for at least 45 seconds.

10. The method of claim 7, wherein the flow rates of the hydrogen gas are from about 3.33 $sccm/cm^2$ to about 16.67 $sccm/cm^2$.

11. The method of claim 7, wherein the flow rates of the hydrogen gas are from about 3.33 $sccm/cm^2$ to about 33.3 $sccm/cm^2$.

12. A method for selective oxidation of non-metal surfaces, comprising:
    positioning a substrate in a processing chamber, wherein the processing chamber is maintained at a pressure between 1 Torr and 2 Torr;
    flowing hydrogen gas in proximity to a hot wire apparatus to generate activated hydrogen gas;
    flowing the activated hydrogen gas into the processing chamber through a first inlet;
    soaking the substrate in the activated hydrogen gas in the absence of plasma comprising oxygen;

generating a remote RF plasma comprising oxygen after soaking the substrate in the activated hydrogen gas, wherein hydrogen comprises at least 70 atomic percent as compared to oxygen;

flowing the remote RF plasma into the processing chamber through a second inlet;

mixing the remote RF plasma with the activated hydrogen gas in the processing chamber to create an activated processing gas;

exposing the substrate to the activated processing gas to oxidize a desired amount of silicon, wherein the activated gas oxidizes silicon surfaces and reduces tungsten surfaces; and cooling the substrate.

13. The method of claim 12, wherein hydrogen comprises at most 95 atomic percent of the activated processing gas.

14. The method of claim 12, wherein the soak process is maintained at a temperature between 600° C. and 800° C. for at least 45 seconds.

15. The method of claim 14, wherein the soak process is maintained at a pressure between about 450 Torr and about 550 Torr of hydrogen.

16. The method of claim 12, wherein the flow rates of the hydrogen gas are from about 3.33 sccm/cm$^2$ to about 16.67 sccm/cm$^2$.

17. The method of claim 12, wherein the flow rates of the hydrogen gas are from about 3.33 sccm/cm$^2$ to about 33.3 sccm/cm$^2$.

* * * * *

UNITED STATES PATENT AND TRADEMARK OFFICE
CERTIFICATE OF CORRECTION

PATENT NO. : 10,714,333 B2  
APPLICATION NO. : 15/183059  
DATED : July 14, 2020  
INVENTOR(S) : Heng Pan et al.

Page 1 of 1

It is certified that error appears in the above-identified patent and that said Letters Patent is hereby corrected as shown below:

In the Specification

In Column 6, Line 35, delete "$^0$ A" and insert -- % --, therefor.

In Column 6, Line 36, delete "$^0$ A" and insert -- % --, therefor.

In Column 6, Line 40, delete "$^0$ A" and insert -- % --, therefor.

In Column 7, Line 3, delete "$^0$ A" and insert -- % --, therefor.

In Column 7, Line 6, delete "$^0$ A" and insert -- % --, therefor.

In the Claims

In Column 8, Line 47, in Claim 9, after "of" insert -- claim --.

Signed and Sealed this  
First Day of September, 2020

Andrei Iancu  
*Director of the United States Patent and Trademark Office*